USOO5850155A

United States Patent [19]
Matsumoto

[11] Patent Number: 5,850,155
[45] Date of Patent: Dec. 15, 1998

[54] BIMOS LOGIC CIRCUIT DIRECTLY CONTROLLABLE BY A CMOS BLOCK FORMED ON SAME IC CHIP

[75] Inventor: Koji Matsumoto, Tokyo, Japan

[73] Assignee: NEC Corporation, Tokyo, Japan

[21] Appl. No.: 758,664

[22] Filed: Dec. 2, 1996

[30] Foreign Application Priority Data

Nov. 30, 1995 [JP] Japan ................................ 7-338188

[51] Int. Cl.⁶ .................... H03K 19/082; H03K 19/094; H03K 19/20
[52] U.S. Cl. .......................... 326/109; 326/66; 327/198; 327/217; 370/112
[58] Field of Search ................................ 326/66, 73, 77, 326/64, 126, 127, 109, 110; 327/198, 217, 199, 215, 218, 212

[56] References Cited

U.S. PATENT DOCUMENTS

| | | | |
|---|---|---|---|
| 4,791,628 | 12/1988 | Swartz | 370/112 |
| 5,298,810 | 3/1994 | Scott et al. | 326/66 |
| 5,311,082 | 5/1994 | Lam . | |
| 5,349,554 | 9/1994 | Delker | 365/189 |
| 5,412,262 | 5/1995 | Nishio et al. | 326/64 |
| 5,457,412 | 10/1995 | Tamba et al. | 326/66 |
| 5,528,171 | 6/1996 | Doi et al. | 326/66 |

FOREIGN PATENT DOCUMENTS

| | | |
|---|---|---|
| 61-273012A | 12/1986 | Japan . |
| 62-020420A | 1/1987 | Japan . |
| 2090627A | 3/1990 | Japan . |
| 2130016A | 5/1990 | Japan . |
| 2192213A | 7/1990 | Japan . |
| 4246911A | 9/1992 | Japan . |
| 5243919A | 9/1993 | Japan . |
| 6500421 | 1/1994 | Japan . |
| 6085659A | 3/1994 | Japan . |

OTHER PUBLICATIONS

Y. Hayakawa et al., "O.5 Micron Low–Power BiCMOS Gate Array for B–ISDN 622 Mb/s User–Network Interface", IEEE Custom Integrated Circuits Conference, (1994), pp. 26.5.4–26.7.1.

Primary Examiner—Michael J. Tokar
Assistant Examiner—Daniel D. Chang
Attorney, Agent, or Firm—Foley & Lardner

[57] ABSTRACT

A single chip IC includes a bipolar logic, a complementary metal-oxide semiconductor (CMOS) logic, and a level translator which interfaces the bipolar logic with the CMOS logic. The single chip IC comprises a MOS transistor logic, provided in the bipolar logic, for receiving a control signal which controls an operation of the bipolar logic. The control signal issues from the CMOS logic and bypasses the level translator and is applied to the MOS transistor logic.

7 Claims, 7 Drawing Sheets

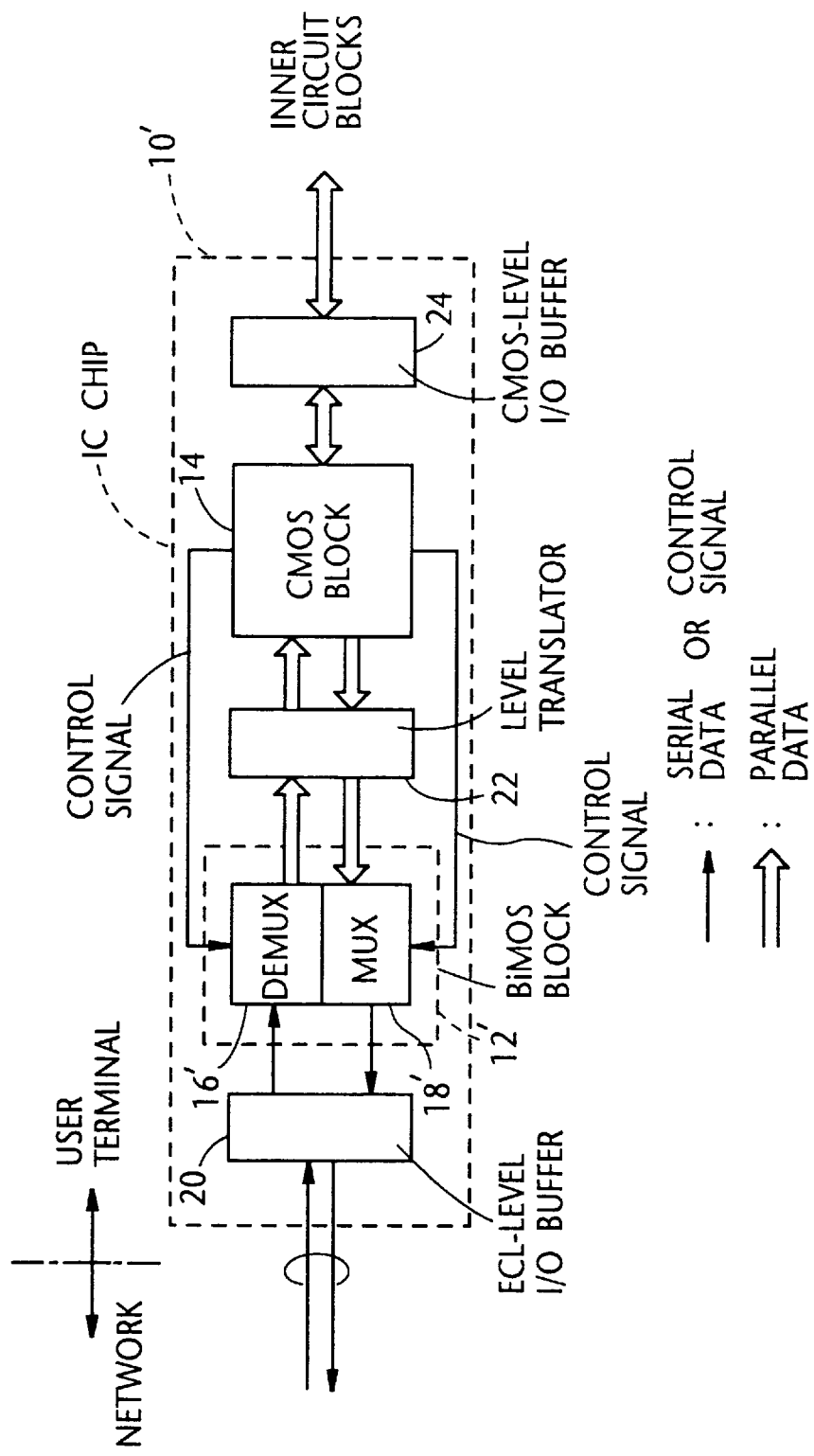

| CLK | $\overline{CLK}$ | D | $\overline{D}$ | S | R | OUT | $\overline{OUT}$ |
|---|---|---|---|---|---|---|---|
| L | H | H | L | L | L | H | L |
| L | H | L | H | L | L | L | H |
| H | L | X | X | L | L | HOLD | HOLD |
| X | X | X | X | H | L | H | L |
| X | X | X | X | L | H | L | H |
| X | X | X | X | H | H | X | X |

FIG. 4B

| CLK | $\overline{CLK}$ | D | $\overline{D}$ | S | R | OUT | $\overline{OUT}$ |
|---|---|---|---|---|---|---|---|
| L | H | X | X | L | L | HOLD | HOLD |
| H | L | X | X | L | L | HOLD | HOLD |
| L→H | H→L | H | L | L | L | H | L |
| L→H | H→L | L | H | L | L | L | H |
| X | X | X | X | H | L | H | L |
| X | X | X | X | L | H | L | H |
| X | X | X | X | H | H | X | X |

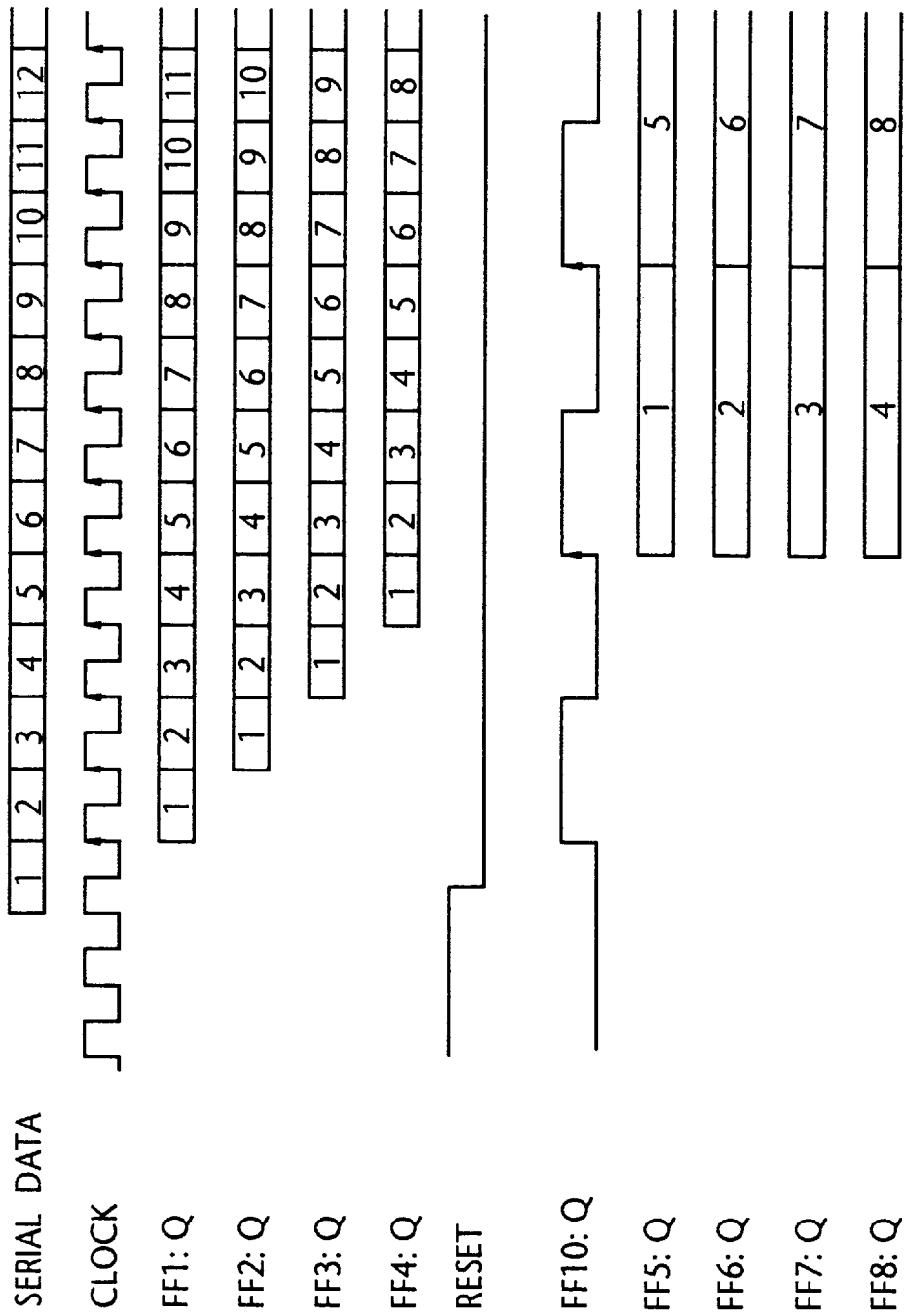

BIMOS LOGIC CIRCUIT DIRECTLY CONTROLLABLE BY A CMOS BLOCK FORMED ON SAME IC CHIP

BACKGROUND OF THE INVENTION

1. Field of the Invention

The present invention relates generally to improved techniques in an IC (integrated circuit) chip, and more specifically to a digital circuit which includes bipolar and unipolar transistors and which is arranged in a manner wherein it can be directly controlled by a CMOS (complementary metal-oxide semiconductor) logic formed on the same chip as the digital circuit. Throughout the instant disclosure, this digital circuit will be referred to as a BiMOS (bipolar MOS) logic.

2. Description of the Related Art

With the advent of recent developments in the field of IC fabrication as well as data communications, a so-called multimedia environment has become a reality. In order to meet the demand for interchanging a large amount of data between personal computers (PCs) or workstations, a B-ISDN (broadband integrated services digital network) has been proposed by CCITT (International Consultative Committee for Telegraphy and Telephony). In such a multimedia network, a variety of high speed serial data are received and transmitted, using ATM (asynchronous transfer mode) techniques, over optical fibers whose terminals are operatively coupled to network user's terminals.

Prior to turning to the present invention it is deemed preferable to describe, with reference to FIG. 1, a conventional IC block for interfacing between the network and the user's terminal (e.g., PC) and processing data. An optical fiber in not shown in FIG. 1 because it is irrelevant to the present invention.

As shown in FIG. 1, a single IC chip 10 is generally comprised of an ECL (emitter-coupled logic) block 12 and a CMOS IC block 14. The ECL block 12, which interfaces the network with the user terminal, is provided with a demultiplexer (DEMUX) 16 and a multiplexer (MUX) 18. The single IC chip 10 further includes an ECL-level I/O (input/output) buffer 20, a level translator 22, and a CMOS-level I/O buffer 24.

In the multimedia network, a aerial data received by the user terminal and transmitted therefrom, is as high as 622 Mbps (mega bits per second) by way of example. In order to process such a very high speed data, it is typical to use an ECL logic as the block 12. More specifically, the ECL block 12 uses bipolar transistors in a nonsaturating mode and thus the block 12 is able to attain very high speed data processing. As is well known in the art, the transistors in the ECL block 12 do not switch full-on or full-off, but swing above and below a given bias voltage. Although the ECL block 12 has the inherent disadvantages of high power consumption and low logic swing (600 mV for example), it is a common practice to use an ECL logic where very high speed is essential.

An incoming high speed data (e.g., 622 Mbps) from the network is converted at the DEMUX 16, into eight (8) parallel data (for example), each rate of which is slowed down to about 78 Mbps. Therefore, although CMOS logics exhibit a data processing speed lower than the ECL circuit, it is typical to use the CMOS logics because the CMOS logics require the least power among the existing digital ICs and can be operated over a wide range of power-supply voltages (3 V–5 V for example).

As mentioned above, the logic swing of the ECL circuit is very small (about 600 mV (for example)) compared with that of the CMOS circuit which is exemplified as 3 V–5 V (viz., supply voltages). For this reason, the ECL block 12 must be interfaced with the CMOS block 14 using the level-translator 22. In connection with the level-translator used in a BiMOS gate array, reducing the number of level-translators has been proposed in a paper entitled "0.5 micron Low-power BiMOS Gate Array for B-ISDN 622 Mb/s User-Network Interface" by Yasushi Hayakawa, et al., 1994 IEEE, pages 607–610. However, this paper fails to present any suggestion that the ECL block can be directly controlled by the CMOS block without the use of the level-translator.

SUMMARY OF THE INVENTION

It is therefore an object of the present invention to provide a digital circuit which includes bipolar and unipolar transistors and which is arranged in a manner wherein it can be directly controlled by a CMOS logic that is formed on the same chip as the digital circuit.

More specifically, an aspect of the present invention resides in a single chip integrated circuit (IC) which includes: a bipolar logic, a complementary metal-oxide semiconductor (CMOS) logic, and a level translator which interfaces the bipolar logic with the CMOS logic. The single chip IC comprises: a MOS transistor logic means, combined with the bipolar logic, for receiving a control signal which controls an operation of the bipolar logic, the control signal being directly applied to the MOS transistor logic means from the CMOS.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 2 is a block diagram schematically showing an IC chip which includes an improved BiMOS logic according to the present invention;

FIG. 4B is a truth table which depicts the operation of the circuit of FIG. 4A;

FIG. 5 is a block diagram schematically showing an example of demultiplexer according to the present invention and FIG. 6 is a timing chart depicting the operation of the demultiplexer of FIG. 5.

DETAILED DESCRIPTION OF THE PREFERRED EMBODIMENTS

The present invention resides in an arrangement of an IC chip which generally includes, in combination, an improved BiMOS block and a CMOS block. More specifically, the BiMOS block can be directly controlled by the CMOS block. That is, according to the present invention, there Is no need to convert the logic level of BiMOS control signals issued from the CMOS block. Therefore, the level-translator can be rendered simpler in configuration and/or operation.

Figure 1:
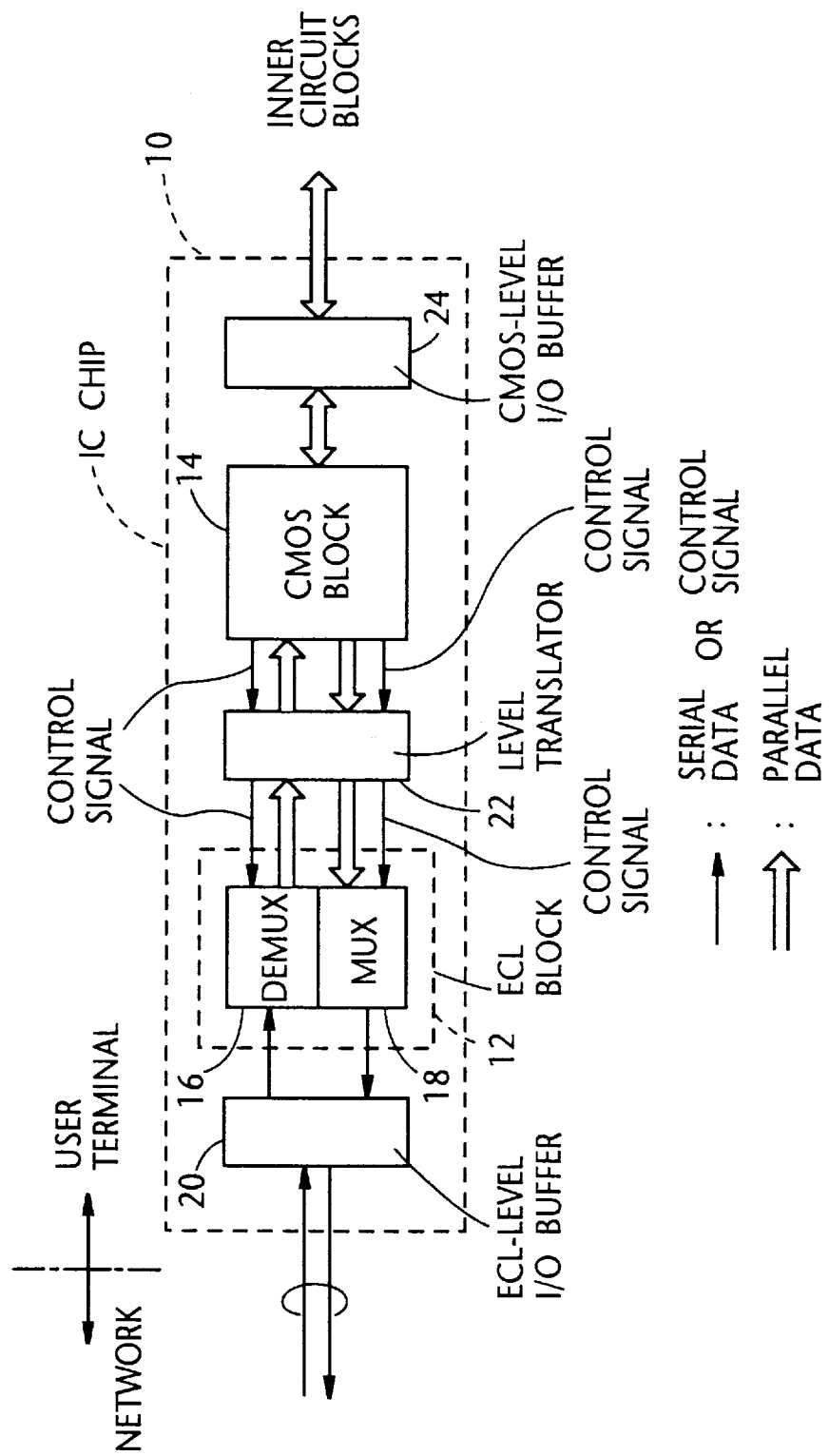
FIG. 1 is a block diagram schematically showing a conventional IC chip, having been referred to in the opening paragraphs of this disclosure.

FIG. 2 is a block diagram schematically showing the above mentioned IC chip (depicted by 10') to which the present invention is applicable. The blocks of FIG. 2, which are essentially identical with the counterparts of FIG. 1, are identified by the same numerals. On the other hand, each of the blocks of FIG. 2, which corresponds to that of FIG. 1, is represented by the same numeral plus a prime.

The arrangement of FIG. 2 differs from that of FIG. 1 in that the former arrangement includes a BiMOS block 12' in place of the ECL block 12, The block 12' includes a DEMUX 16' and a MUX 18' each of which is configured in a manner whereby it can be directly controlled by the CMOS block 14. Other than this, the IC chip of FIG. 2 is essentially identical to that of FIG. 1.

Figures 3A, 3B:
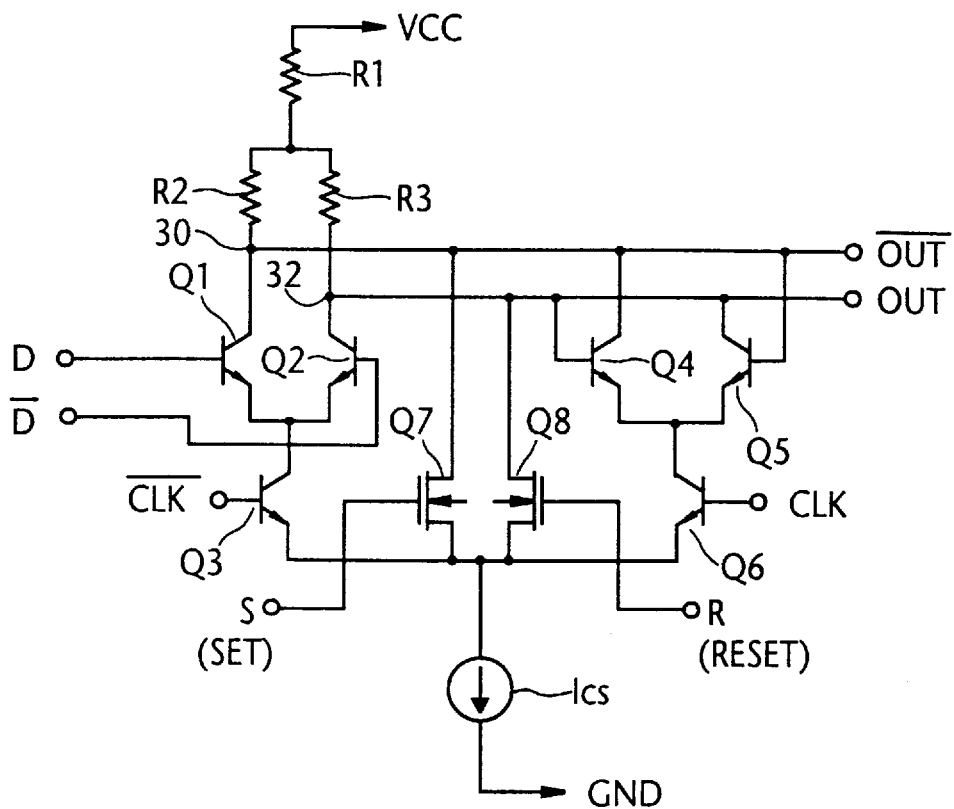
FIG. 3A is a circuit diagram showing a set/reset type latch according to the present invention.
FIG. 3B is a truth table which depicts the operation of the circuit of FIG. 3A.

FIG. 3A is a diagram showing a latch which includes a plurality of bipolar transistors for temporarily holding incoming data, and which can be set or reset using MOS transistors. Thus, the circuit of FIG. 3A is a BiMOS circuit in that it includes both bipolar and unipolar (MOS) transistors. The circuit of FIG. 3A is presented in preparation for describing a set/reset type mater-slave D flip-flop shown in FIG. 4A which is directly relevant to the present invention.

The latch shown in FIG. 3A is provided between a power source VCC and a ground terminal GND and, includes resistors R1–R3, bipolar transistors Q1–Q6, n-channel MOS transistors Q7 and Q8, and a constant current-source (depicted by Ics). The manner in which the circuit elements of FIG. 3A are connected will be self-evident from this figure and accordingly, a detailed description thereof will be omitted merely for the sake of simplifying the disclosure.

The transistors Q1 and Q2 form a differential pair (differential amplifier) at a data input side, and are respectively supplied with differential data D and /D at the bases thereof (the notation "/" means a bar over the following letter(s) in the accompanying drawings). The emitters of the transistors Q1 and Q2 are directly coupled and further coupled to the collector of the transistor Q3.

The transistors Q4 and Q5 form another differential pair at a data latch side. The emitters of the transistors Q4 and Q5 are directly coupled and further coupled to the collector of the transistor Q6. On the other hand, the emitters of the transistors Q3 and Q6 are directly coupled and further coupled to a ground terminal GND via the current source Ics. The transistors Q3 and Q6 receive respectively differential clocks /CLK and CLK at the bases thereof, and constitute a differential pair.

Voltages appearing at junctions 30 and 32 are outputs /OUT and OUT which change their logic levels in a differential manner.

A current flow path from VCC to GND is changed depending on the ON and OFF states of the transistors Q1–Q6 and therefore, the bipolar portion of FIG. 3A is referred to as a current switch (or current mode switch (CML)).

The two differential pairs (Q1–Q2 and Q4–Q5) exhibit a first differential stage of the current switch, while the transistors Q3 and Q6 form a second differential stage of the current switch.

The n-channel MOS transistors Q7 and Q8 have their sources directly coupled and further coupled to the current source Ics. Set/reset signals S and R are respectively applied to the gates of the transistors Q7 and Q8 to fix the outputs OUT and /OUT.

The operation of the latch of FIG. 3A is described with reference to a truth table shown in FIG. 3B. A notation "X" in the truth table indicates that each of the corresponding logic levels is not questioned (viz., may be either high or low). It is assumed that the set/resent signals S and R both assumes a low level (L).

Referring to the first row of the truth table. The clocks CLK and /CLK respectively assume low and high levels respectively and, simultaneously, the data D assumes a high level (namely, the data /D assumes a low level). Therefore, the transistors Q3 and Q6 are rendered conductive and non-conductive, respectively. Since the transistor Q2 is in a non-conductive state in the instant case, a current path is established from VCC to GND through the resistors R1 and R2, the transistors Q1 and Q3, and the current source Ics. This means that the outputs OUT and /OUT exhibit respectively high and low levels.

The second row of the truth table shows that the clocks CLK and /CLK, as in the above case, respectively assume low and high levels. However, the data D assumes a low level while the data /D takes on a high level. Therefore, since the transistor Q1 is rendered non-conductive, a current flows from VCC to GND by way of the resistors R1 and R3, the transistors Q2 and Q3, and the current source Ics. Accordingly, the outputs OUT and /OUT respectively assume low and high levels in this case.

Immediately after either of the above mentioned two situations occurs, when the clocks CLK and /CLK change respectively to high and low levels (the third row of the truth table), the previous outputs OUT and /OUT remain unchanged (viz., are latched or held).

On the other hand, when the set/reset signals S and R respectively assume high and low levels, the n-channel MOS transistors Q7 and Q8 are respectively rendered conductive and non-conductive. Thus, the outputs OUT and /OUT are set to high and low levels respectively (the fourth row of the truth table). However, in the case when the set/reset signals S and R respectively assume low and high levels, the transistors Q7 and Q8 are rendered non-conductive and conductive, respectively. Thus, the outputs OUT and /OUT are reset to low and high levels respectively (the fifth row of the truth table), Finally, when the set and reset signals S and R both assume high levels, the outputs OUT and /OUT become uncertain.

Figure 4A:
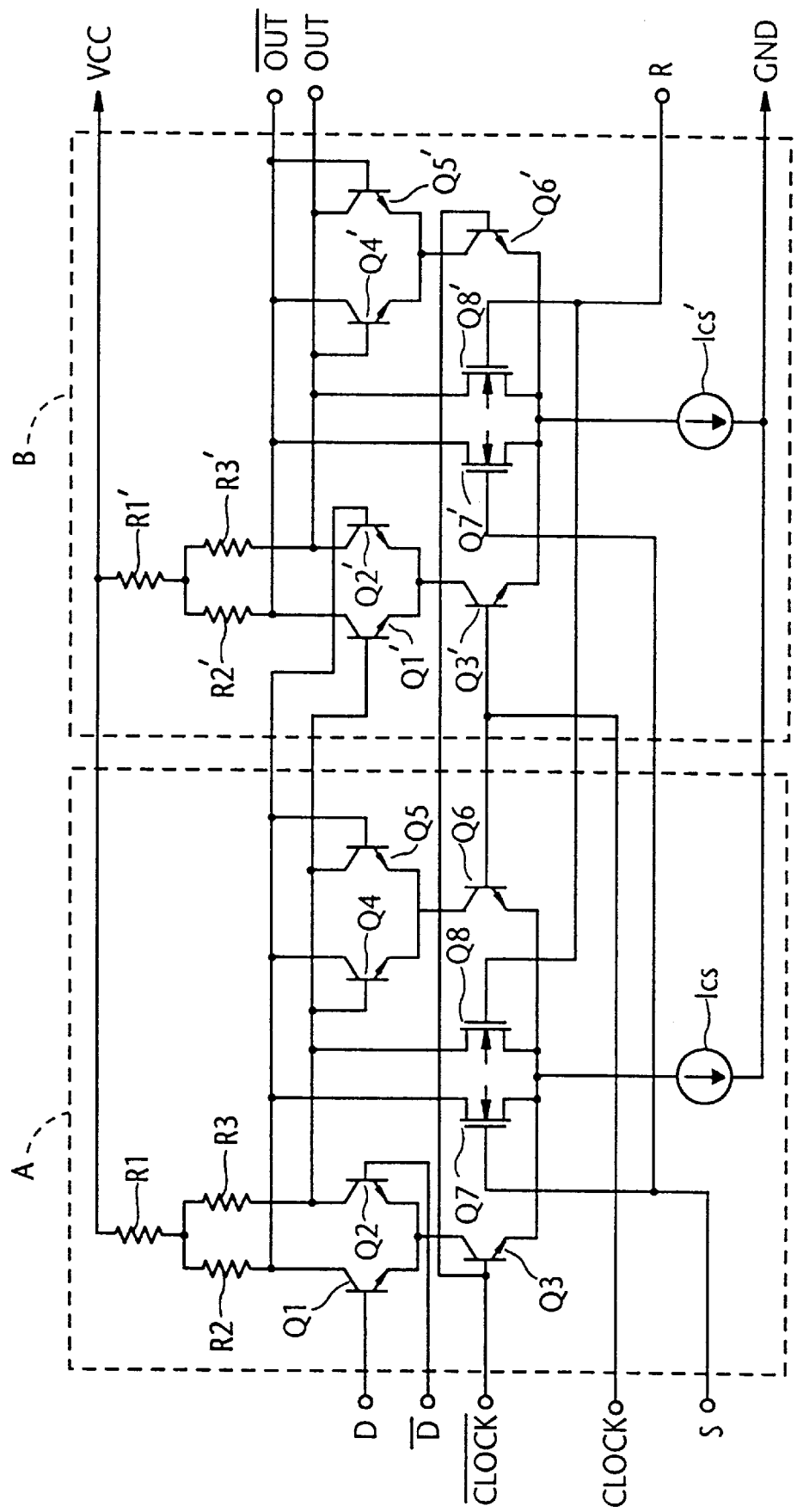
FIG. 4A is a circuit diagram showing a set/reset type master-slave delay flip-flop according to the present invention.

FIG. 4A is a circuit diagram showing a set/reset type master-slave D flip-flop which is comprised of a combination of two latches of the nature shown in FIG. 3A. That is, two set/reset type latches (designated by A and B) are arranged in tandem as shown in FIG. 4A. The elements of latch A, which correspond to those of FIG. 3A, are depicted by the same notations, while the corresponding elements of latch B, are represented by the same notations plus primes. A truth table depicting the operation of the circuit of FIG. 4A is shown in FIG. 4B.

The operation of master-slave D flip-flop is well known in the art and therefore, only a brief description thereof will be given. When the clock CLK goes high, the incoming data D and /D are acquired whereby the outputs OUT and /OUT assume the same values as the acquired incoming data D and /D (the third and fourth rows of the truth table of FIG. 4B). Following this, until the next rising edge of the clock CLK, the outputs OUT and /OUT are held. Subsequently, when the clock CLK again goes high, the next incoming data D and /D are held in the flip-flop of FIG. 4A. This means that the output of data D and /D is delayed by one clock cycle.

The D flip-flop of FIG. 4A is set and reset in a manner which has been described with reference to FIGS. 3A and 3B. That is, the set/reset signals S and R are applied to the gates of the MOS transistors Q7, Q8, Q7' and Q8'. This implies that the signals S and R can be directly derived from the CMOS block 14 (FIG. 2).

Figure 5:
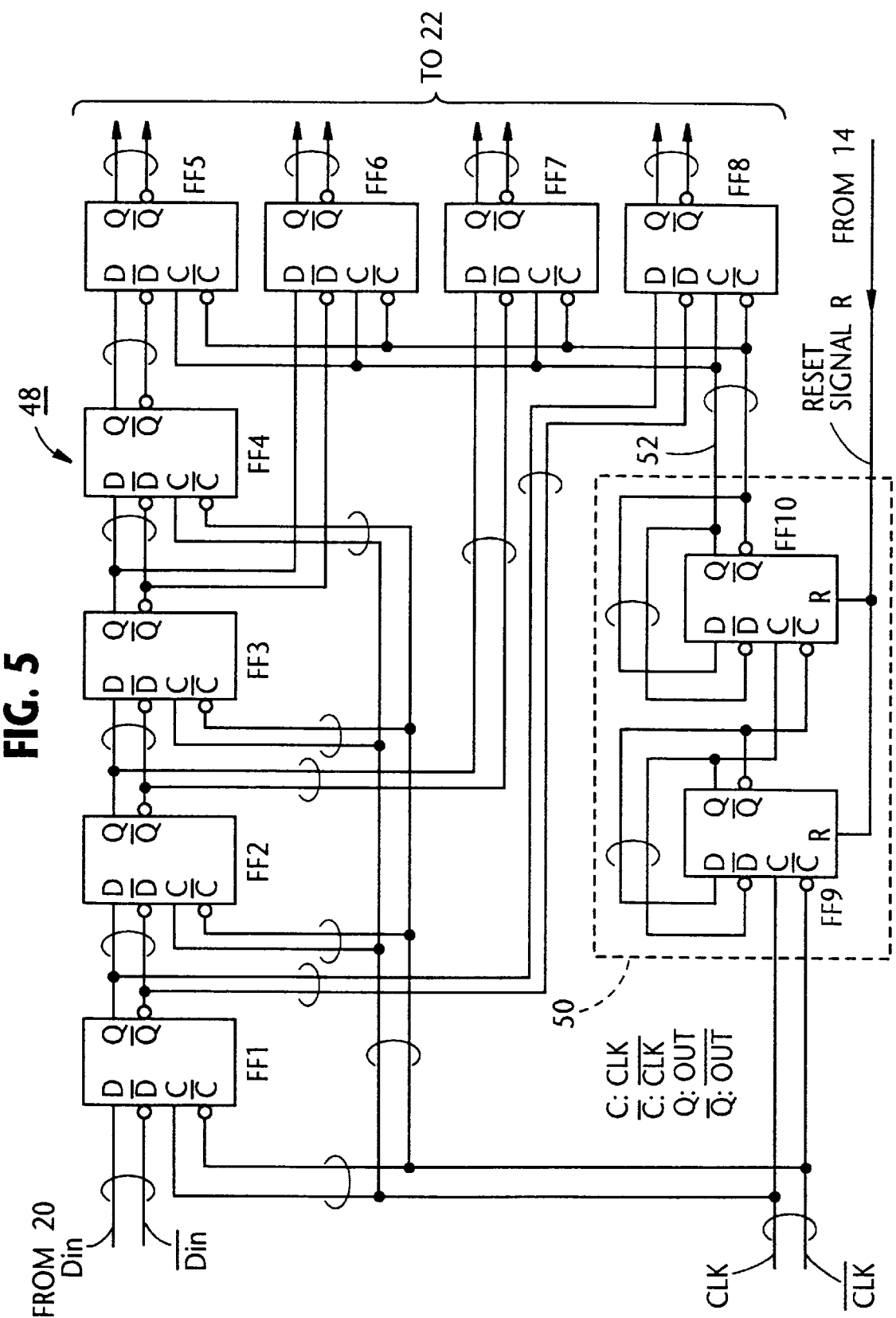

Reference is made to FIG. 5, wherein a 1:4 DEMUX (designated by the numeral 48) is shown in block diagram form. The 1:4 DEMUX 48 includes a plurality of conventional high speed bipolar flip-flops FF1–FF8 and a master-slave D flip-flop 50 which corresponds to the circuit of FIG. 4A. More specifically, the flip-flops FF9 and FF10 are essentially identical to the circuits A and B of FIG. 4A, respectively. It is to be noted that the set signal S shown in FIG. 4A is not used in this case. However, it goes without saying that the set signal S can be used instead of the reset signal R. It is quite easy for those skilled in the art to expand the 1:4 DEMUX to a 1:8 DEMUX (for example).

In FIG. 5, a pair of differential input data Din and /Din are applied, as a serial data, to the DEMUX 48 from the ECL-level I/O buffer 20 (FIG. 2). Further, a reset signal R is directly applied to the D flip-flop 50 from the CMOS block 14 (FIG. 2).

The operation of the 1:4 DEMUX 48 will readily be appreciated and thus, only a simple description thereof is given with reference to a timing chart shown in FIG. 6.

When the reset signal R is applied to the flip-flops FF9 and FF10, the master-slave D flip-flop 50 generates, from the flip-flop FF10, a clock 52 whose period is four (4) times the original clock CLK (and /CLK). The flip-flops FF1 to FF4 successively latch the respective incoming data 1, 2, 3, ... each time the clock CLK goes high, and apply respectively the outputs thereof to the flip-flops FF8–FF5 in a manner illustrated. Thus, the flip-flops FF5–FF8 generate four parallel data which are applied to the level translator 22 (FIG. 2).

In the above description, it is to be noted that even before the reset signal assumes a low level, the flip-flops FF1–FF4 successively acquire the incoming data Din and /Din. However, the flip-flops FF5–FF8 remain disable because the clock 52 is not applied thereto.

While only a detailed description of the circuit of DEMUX 16' has been given. However, it will be readily apparent to those skilled in the art to which the invention pertains that a BiMOS logic for use in the MUX 18' could be readily constructed once equipped with the knowledge of the principle on which the present invention is based.

In view of the foregoing, it will be appreciated that the present invention renders it possible for the CMOS block to directly apply the control signal (set and/or reset signal) to the BiMOS logic which operates at a very high speed using bipolar transistors. In other words, the control signal no longer requires level translation before being applied from the CMOS block to the high speed bipolar circuit of the BiMOS logic.

It should be understood that the foregoing description is only illustrative of the present invention and that various alternatives and modification can be devised by those skilled in the art without departing from its scope. Accordingly, the present invention, which embraces all such alternatives, modifications and variances is limited only by the scope of the appended claims.

What is claimed is:

1. A single chip integrated circuit (IC) including, a bipolar logic, a complementary metal-oxide semiconductor (CMOS) logic, and a level translator which interfaces said bipolar logic with said CMOS logic, said single chip IC comprising:

a MOS transistor logic means, combined with said bipolar logic, for receiving a control signal which controls an operation of said bipolar logic, said control signal being directly applied to said MOS transistor logic means from said CMOS.

2. A single chip IC as claimed in claim 1, wherein said bipolar logic is a pair of set/reset type latches which are arranged in tandem with each other and which each comprises:

first and second pairs of bipolar transistors, provided in parallel between power sources, for respectively receiving and latching data;

a third pair of bipolar transistors, coupled in series, between said power sources, with said first and second pairs of bipolar transistors, said third pair of bipolar transistors responding to a clock signal applied thereto and switching a first power source current path between said first and second pairs of bipolar transistors, wherein said MOS transistor logic means responds to said bipolar logic control signal and establishes a second power source current path therein, instead of said first power source current path, for setting or resetting said bipolar logic.

3. A single chip IC as claimed in claim 2, wherein said MOS transistor logic means includes a plurality of n-channel MOS transistors whose gates receive said bipolar logic control signal.

4. A single chip IC as claimed in claim 2, further comprising a constant current source which is provided in series with both said third pair of bipolar transistors and said MOS transistor logic means.

5. A single chip integrated circuit (IC) comprising:

a logic circuit including, in combination, a bipolar logic and a metal-oxide semiconductor (MOS) logic;

a complementary MOS logic; and a level translator which interfaces said bipolar logic with said complementary MOS logic, wherein said bipolar logic takes a form of a pair of set/reset type latches which are arranged in tandem with each other and which each comprises:

first and second pairs of bipolar transistors, provided in parallel between power sources, for respectively receiving and latching data;

a third pair of bipolar transistors, coupled in series, between said power sources, with said first and second pairs of bipolar transistors, said third pair of bipolar transistors responding to a clock signal applied thereto and switching a first power source current path between said first and second pairs of bipolar transistors, and wherein said MOS logic receives a bipolar logic control signal directly from said complementary MOS logic and establishes a second power source current path therein, instead of said first power source current path, for setting or resetting said bipolar logic.

6. A single chip IC as claimed in claim 5, wherein said MOS transistor logic means includes a plurality of n-channel MOS transistors whose gates receive said bipolar logic control signal.

7. A single chip IC as claimed in claim 5, further comprising a constant current source which is provided in series with both said third pair of bipolar transistors and said MOS transistor logic means.

* * * * *